United States Patent [19]

Knauer

[11] 4,395,691

[45] Jul. 26, 1983

[54] BEAM DEFLECTION SYSTEM

[75] Inventor: Wolfgang Knauer, Malibu, Calif.

[73] Assignee: Hughes Aircraft Company, El Segundo, Calif.

[21] Appl. No.: 354,699

[22] Filed: Mar. 4, 1982

[51] Int. Cl.³ .............................................. H01F 7/00
[52] U.S. Cl. .................................... 335/210; 335/213; 250/396 ML
[58] Field of Search ................ 335/210, 213; 313/425, 313/426; 250/396 R, 396 ML

[56] References Cited

U.S. PATENT DOCUMENTS 3,930,181 12/1975 Pfeiffer .......................... 250/396 ML
4,245,159 1/1981 Beisswenger ................ 250/396 ML Primary Examiner—George Harris
Attorney, Agent, or Firm—Allen A. Dicke, Jr.; William J. Bethurum; Anthony W. Karambelas

[57] ABSTRACT

Deflection of an electron beam from axis 28 is controlled by electromagnetic deflection saddle coils 24, 26. Interference with deflection by surrounding mass of lens 22 is overcome by compensation coils 42, 44. The deflection coils and compensation coils are shaped and sized so that their own conductive properties do not distort the deflection magnetic fields. This is accomplished by equalizing between the deflection and compensation coils, the change in magnetic field during coil current penetration and by equalizing the penetration time constants for both sets of windings.

16 Claims, 7 Drawing Figures

BEAM DEFLECTION SYSTEM

TECHNICAL FIELD

This invention is directed to a deflection system for deflecting charged particle beams.

BACKGROUND OF THE INVENTION

It is often desirable to rapidly and accurately deflect an electron or ion beam. In beam systems, the beam is necessarily surrounded by equipment for maintaining a vacuum, as well as shaping, deflecting and focusing the beam. In high speed submicron lithography, an electron beam is imaged toward the target. In the class of structures considered herein, the final lens is a large bore lens having a pair of saddle coils positioned therein for deflecting the beam on the target.

The accuracy of a magnetic deflection system is determined in part by the degree to which magnetic field interactions with surrounding conductors are avoided or compensated. These interactions produce eddy currents and thus parasitic magnetic fields. The parasitic magnetic fields cause temporary spot displacements.

Two types of eddy currents can be distinguished, and neither can be tolerated at an uncorrected level if deflection accuracies near 20,000 lines per field are desired. The first type of eddy current results from interactions between the deflection field and surrounding conductors. The most massive conductor is usually the final lens iron yoke. Eddy currents in this yoke result in fields which can produce deflection short-fall in the range of 0.1 to 1% (of the desired deflection distance) and which typically lasts 10 to 100 milliseconds. Eddy currents of this type are referred to herein as "outer" eddy currents. G. A. Wardly considered these outer eddy currents in his article in *Journal of Applied Physics*, Vol. 44, No. 8, August 1973, pp. 3766–3769, in his article in *Journal of Applied Physics*, Vol. 44, No. 12, December 1973, at pp. 5607–5612, and in his article in *Journal of Applied Physics*, Vol. 45, No. 5, May 1974, at pp. 2316–2320.

It has been determined that there is a second eddy current phenomena in the skin effect in the deflection coils. It arises from interactions between the deflection field and wires of the deflection coil. Accordingly, there is need for a means by which this second eddy current phenomena can be compensated.

SUMMARY OF THE INVENTION

In order to aid in the understanding of this invention, it can be stated in essentially summary form that it is directed to a beam deflection system wherein beam deflection coils are in the form of a pair of inner deflection coils and a pair of outer deflection coils wherein the coils are arranged so that the magnetic field increments due to skin effect will cancel and the decay time constants of the coils are substantially equal.

It is thus a purpose and advantage in this invention to provide a beam deflection system wherein both the external and internal eddy current causes of magnetic field deflection forces on the beam are cancelled by choosing deflection coils and compensating coils of such size, positioning, wire size ratios, turns ratios, and materials so that magnetic field effects on beam deflection due to eddy currents in the coils and in surrounding structure are overcome.

Other purposes and advantages of this invention will become apparent from a study of the following portion of this specification, the claims and the attached drawings.

DETAILED DESCRIPTION OF THE INVENTION

Figure 1:
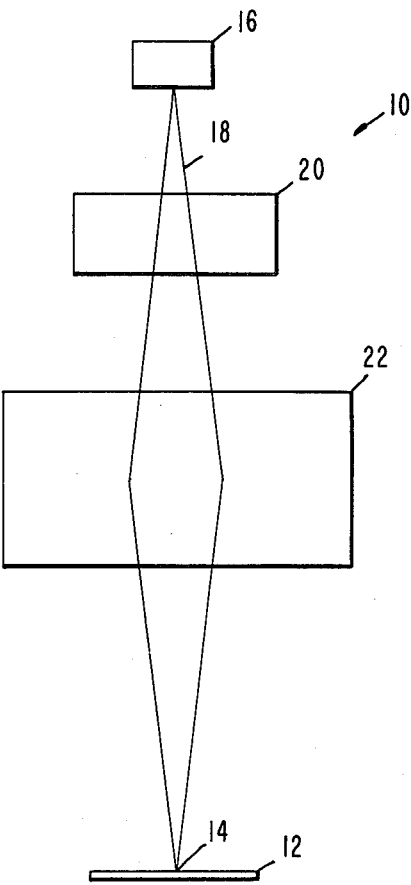
FIG. 1 is a schematic diagram of a portion of a beam device, and particularly an electron beam device.

A beam system is generally indicated at 10 in FIG. 1. The beam in system 10 is an electron beam to be deflected by the deflection coils of this invention. When the beam system 10 is employed to write on a photoresist 12, generation, accelaration, fine focusing, and accurate positioning of beam 18 are necessary. Beam 18 is produced by the source 16. Beam 18 is first treated as required by beam treatment means 20. The beam treatment means 20 can be focusing alignment, and shaping as required for the particular beam situation. Axially positioned along the beam path from source 16 to beam spot 14 is final beam demagnifying lens 22 which, in the case of a Gaussian electron beam source, focuses an image of the source at the beam spot 14. Should beam treatment means 20 include a beam shaping operation, final lens 22 focuses a demagnified image of the spot aperture at beam spot 14.

Figure 2:
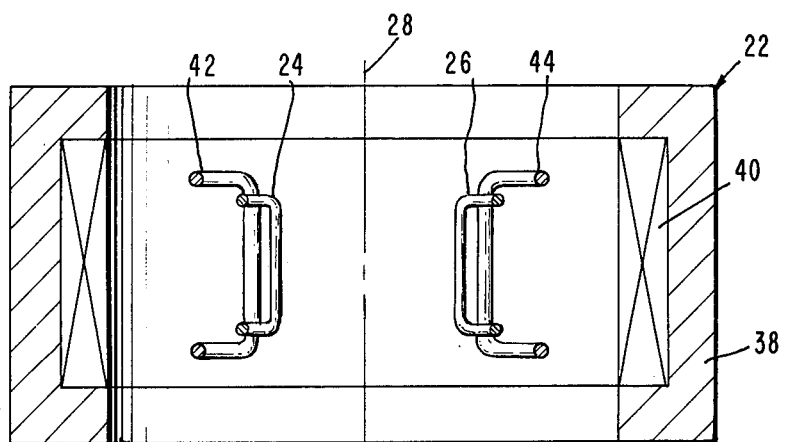
FIG. 2 is a perspective view of the final lens together with the deflection coils and compensation coils contained therein.
Figure 3:
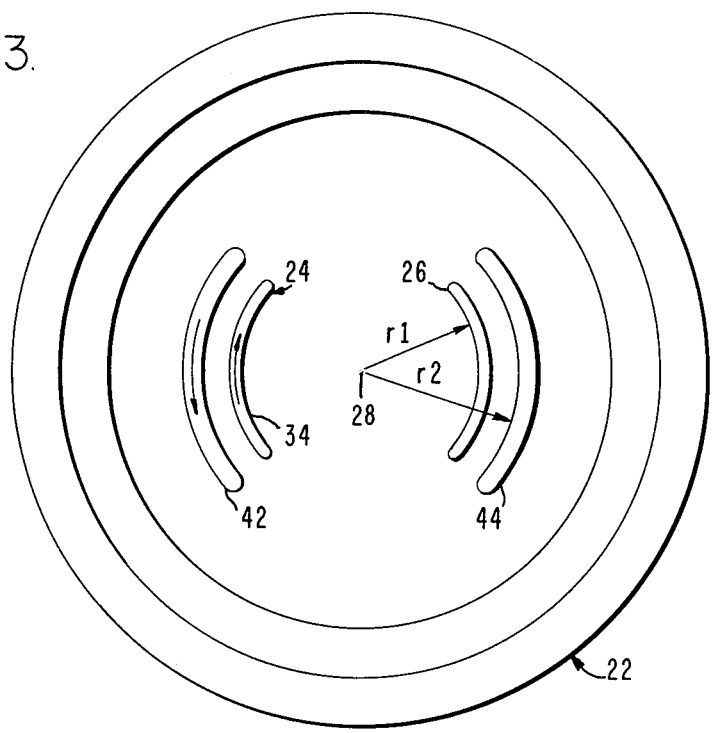
FIG. 3 is a plane view thereof.
Figure 4:
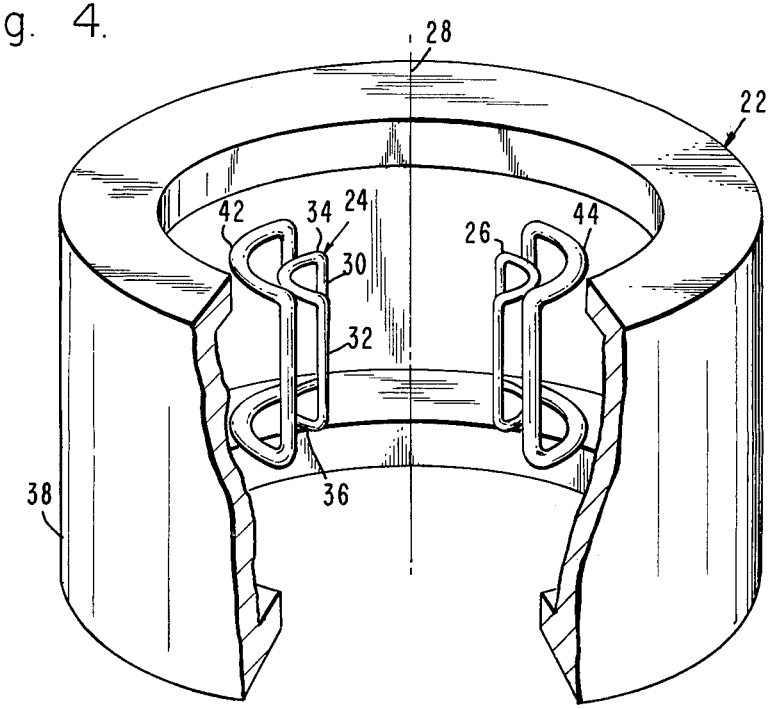
FIG. 4 is an axial section, taken generally along line 4—4 of FIG. 3.

As is seen in FIGS. 2, 3, 4, 5, 6 and 7, deflection coils 24, 26 form a pair of saddle coils on opposite sides of the central axis 28, which is also the center line of the undeflected beam 18. Deflection coil 24 is a specific example, and as is seen in FIG. 2, it has straight legs 30, 32 which are parallel to and equidistant from axis 28. The legs are connected by yokes 34, 36 which are curved to be of constant radius with respect to central axis 28. Because of this curved shape of the yokes, these coils are usually called saddle coils. Coil 26 is identical and has the same components directly across the axis. These deflection coils cause deflection in one plane through the axis, which is normal to the plane on which the section line is taken in FIG. 3. For practical, rectangular deflection, at least one other pair of coils is positioned around the axis 28 at an angle to the coils 24, 26. However, for the purpose of explanation, only the deflection in the single plane need be described.

Final lens 22 is made up of a soft iron yoke 38 in which is located electric coil 40 which provides the focusing magnetic field within the lens. High speed deflection current in deflection coils 24, 26, induces eddy currents in the copper and iron of final lens 22. The induced currents can slow down the beam deflection to a pace where the lithography becomes impractical. Compensation coils 42, 44 are geometrically similar, larger coils positioned around the deflection coils 24, 26. By use of compensation coils, the magnetic dipoles of the deflection coils 24, 26 can be converted into higher order magnetic poles. While dipole fields decay with the third power of distance, quadrupole and octupole fields decay with fourth and fifth power of the distance, respectively. Accordingly, smaller eddy currents are generated and hysteresis is significantly reduced. The compensation coils 42, 44 are configured and energized to cancel the dipole field. In the absence of the dipole field, each pair of deflection coils and compensation coils generates an octupole field. With the high degree of symmetry of the two concentric coils, the quadrupole moments are zero. Therefore the field decays proportional to $(1/r_2)^{-5}$ where $r_2$ is the radius of the compensation coils 42, 44.

When such a structure is properly designed, the compensation coils 42, 44 compensate for the eddy currents in the yoke 38 and focus coil 40 of the final lens 22 and other conductive structures external to the deflection coils 24, 26. However, this structure is not a complete remedy for eddy current interaction with beam deflection which causes delays in deflections to the full desired beam deflection.

It is critical to this invention to design the deflection coils 24, 26 and the compensation coils 42, 44 so that eddy current inside the deflection coils 24, 26 and the compensation coils 42, 44 also have proper compensation. It is critical to this invention that the windings of the compensation coils 42, 44 be provided with size and position, together with a specific wire diameter and specific electrical resistivity such that the magnetic field increments caused by eddy currents in both the deflection coil and compensation coil windings cancel out. At the same time, the original feature of compensation for eddy currents in the surrounding conductors is retained.

In review, eddy currents arise in electrical conductors when changing magnetic fields attempt to penetrate through these conductors. In the case of the beam deflection coils 24, 26, this occurs when the coil current is varied for the purpose of deflecting the beam 18 so that its spot 14 moves across target 12. Thus, changing the current in the deflection coils 24, 26 changes the magnetic fields surrounding coils 24, 26 and produces eddy currents in lens yoke 22 and other adjacent electrically conductive structures. These eddy currents persist until the field has penetrated through these parts and has become a uniform field, without further change. While the eddy currents flow, they generate magnetic fields of their own. Since these latter fields oppose the original magnetic fields produced by the coil current, the beam 18 is initially subjected to a reduced net magnetic deflection field. Only as the eddy currents decay can the beam creep to its final destination. With typical structural geometry, the initial deflection short-fall can be in the order of 0.2% of the deflection distance. These effects can be called the external eddy current effects. The external eddy currents affect the beam deflection with a time constant in the order of 10 milliseconds.

Figure 5:
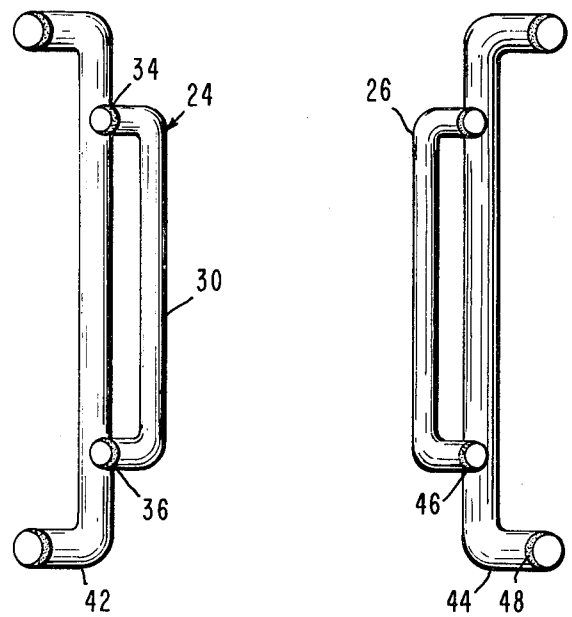
FIG. 5 is an enlarged axial section through the deflection and compensation coils as seen generally along line 5—5 of FIG. 3, showing the early stages of current flow through the skin of the conductors in the coils.
Figure 6:
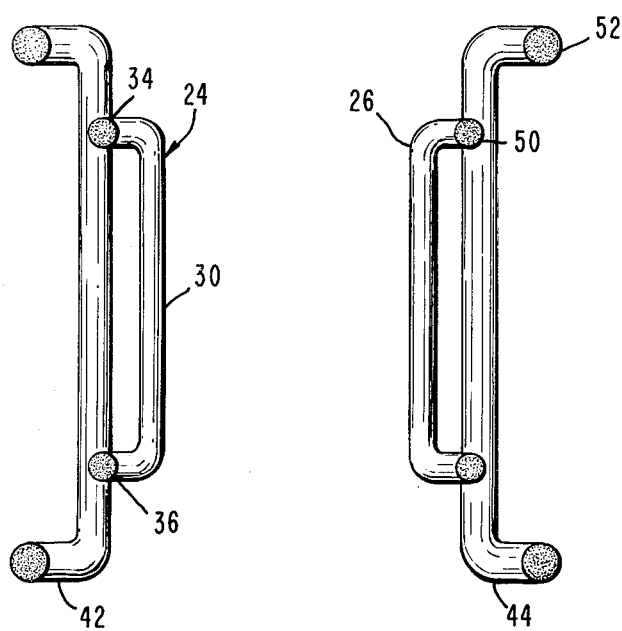
FIG. 6 is a view similar to FIG. 5, but at a later time when the magnetic fields are stabilized in the region of the coil windings.
Figure 7:
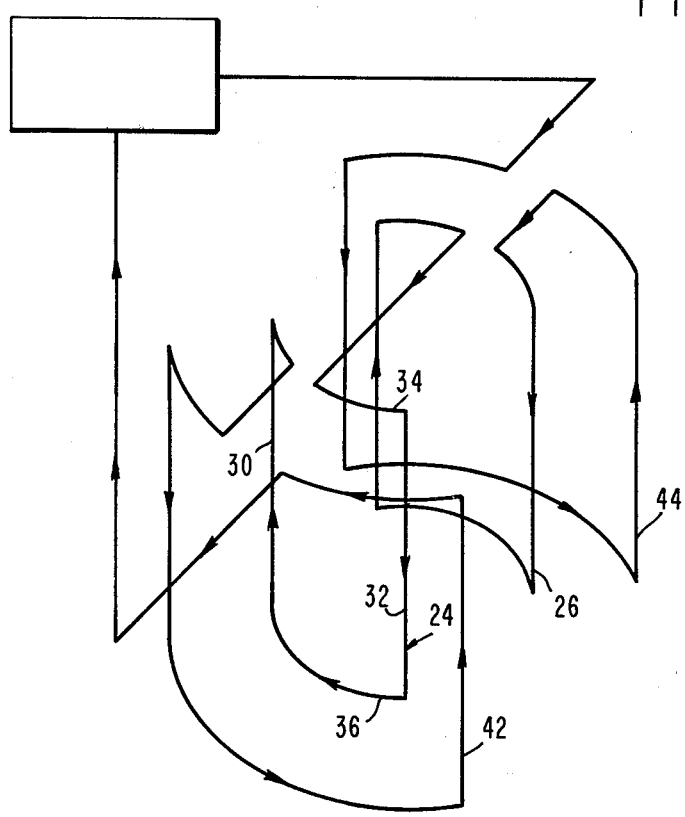
FIG. 7 is a schematic isometric view showing the connections of the deflection coils.

A related phenomena occurs inside the coil windings of both the deflection coils 24, 26 and the compensation coils 42, 44. As the coil current begins to flow, eddy currents arise in the coils which result in the displacement of the coil current to the wire surface. This phenomenon is the skin effect. The current caused magnetic field slowly penetrates into the wire and allows the current itself also to enter the wire. Eventually, the current reaches a uniform distribution across the cross-section of the wire. In a single, straight wire the initial skin current is distributed evenly around the outer wire periphery. In a coiled wire, the skin current flows mostly at the inner radius of the wire, where most of the magnetic field resides. FIG. 5 illustrates the distribution of current flow in the wire soon after the beginning of such current flow. The current is illustrated as flowing in the dotted area 46 of coil 26 and in the dotted area 48 of compensation coil 44. Due to this unsymmetry, the apparent coil diameter is larger until the current penetrates into the wire core. FIG. 6 illustrates dotted areas 50, 52 as being uniformly distributed across the wire cross-section to indicate that the current eventually becomes uniformly distributed across the wire. The apparent effective coil diameter decreases to real value while the current penetrates into the uniform distribution. Accordingly, the magnetic deflection field radius decreases slightly and the beam creeps slowly from the position of over-shoot to its final location. In a typical configuration, the over-shoot can amount to 0.5% of the total deflection distance. This change in deflection due to current distribution in the wire can be called internal eddy current deflection. The time constant for the internal eddy current deflection is in the order of 100 microseconds.

The external and internal eddy current each cause a creep in the beam to occur and in opposite directions, but rather than cancelling themselves out, the time constants of the two effects are sufficiently different that each component must be separately corrected. For external eddy currents, the use of properly configured and positioned compensation coils 42, 44 is satisfactory.

The apparent coil radius change is due to the growth of the current area from the skin on the interior side to the whole coil area in both the deflection coils 24, 26 and the compensation coils 42, 44. The deflection coils 24 and 26 are connected in series and act in the same direction, and the compensation coils 42 and 44 are connected in the same series and act opposite to the deflection coils, see FIG. 7. Since the current in the compensating coils flows in the opposite direction to the current in the deflection coils, the compensation coils generate a magnetic field of opposite polarity on the beam axis 28. Thus, the field increments due to the internal eddy currents are also of the opposite polarity. In order that eddy current creep be avoided, the increments must cancel and their decay time constants must be equal. This can be achieved by suitable coil design in accordance with this invention. The field increments can be made to cancel by suitable choice of wire diameter ratio in the deflection coils 24, 26 as compared to the compensating coils 42, 44. The decay time constants can be made equal by suitable choice of the wire resistivity ratio between the wires in the two types of coils. For circular coils, the appropriate ratios can be analytically determined in accordance with the following example. In a preferred example, the circular deflection coils 24, 26 have two turns and have a radius $r_1$. Also, the compensating coils 42, 44 have one turn and a radius of $r_2$. The dipole moments of such coils are:

$$M_1 = \pi r_1^2 \frac{I_2}{C} N_1 \tag{1}$$

$$M_2 = \pi r_2^2 \frac{I_2}{C} N_2 \tag{2}$$

In these relationships, the subscripts 1 are related to the deflection coils 24, 26 and the subscripts 2 are related to the compensation coils 42, 44 and:
M-dipole moment
r-coil radius
I-coil current
N-number of coil turns
C-velocity of light.

In order that the external eddy currents be avoided, the two dipole moments $M_1$ and $M_2$ must be equal. Setting them equal, and assuming that the same current passes through both coils, and with two turns on the deflection coils and one turn on the compensation coils, the radius ratio of the two coils is determined by their turns ratio as:

$$r_2/r_1 = (N_2/N_1)^{\frac{1}{2}} = \sqrt{2} \tag{3}$$

In order that the internal eddy currents be corrected, the magnetic field changes on the beam axis due to apparent coil radius changes must be eliminated. The magnetic field on the axis is:

$$H = \frac{2\pi}{C} I \left( \frac{N_1}{r_1} - \frac{N_2}{r_2} \right) \tag{4}$$

where H is the field strength. The incremental change in the field strength H during coil current penetration is given by:

$$\Delta H = \frac{2\pi}{C} I \left( \frac{\Delta r_2}{r_2^2} N_2 - \frac{\Delta r_1}{r_1^2} N_1 \right) \tag{5}$$

where $\Delta r_1$ and $\Delta r_2$ are the radii of the wires in the deflection coils and compensation coils, respectively. The change in field $\Delta H$ must vanish if the winding-related eddy current effects are to be avoided. Setting the above-equation equal to zero and simplifying results in the following relationship when the field changes zero:

$$\Delta r_2/\Delta r_1 = (N_2/N_1)(r_2^2/r_1^2) \tag{6}$$

In the present example where $N_2/N_1$ is 2, the radius ratio $\Delta r_2/\Delta r_1 = 2 \times 2 = 4$. This relationship provides for changes in the effect of radius due to magnetic field penetration being compensated so that beam deflection is not affected by skin effects. However, the penetration time constants for the magnetic field penetration must be equal so that the effect on each of the windings occurs at the same time for full compensation. The eddy current penetration time is given by:

$$\tau = C \Delta r^2 / \rho \tag{7}$$

where:
$\tau$-penetration time
$\rho$-wire resistivity.
In order that $\tau_1$ and $\tau_2$ of the deflection coils and compensation coils be equal, the resistivity ratio must be:

$$\rho_2/\rho_1 = (\Delta r_2/\Delta r_1)^2 \tag{8}$$

In this specific example given above, with a coil radius ratio of 2 and a turns ratio of 2, the resistivity ratio becomes 16. Thus, when the compensation coils times the radius $2 \times 2 = 4$ times the wire diameter and 16 times the wire resistivity of the deflection coil, internal as well as external eddy currents are exactly compensated for by the relationship between the deflection and compensation coils so that the deflection of beam 18 is undisturbed by such components.

Continuing the specific example, the deflection coil has a radius r of lens, a wire diameter $\Delta r$ of 0.05 cm, with two turns of copper. Following the teaching of this invention, the compensation coils have a radius $r_2$ which is 2 times the radius $r_1$ so that it is 1.41 cm, a wire diamter $r_2$ 4 times the wire diameter $\Delta r_1$ so that it is 0.2 cm, has 1 turn and is made up of a material of 16 times the resistivity, for example of platinum-iridium.

For coils which are non-circular the derived relationships are modified by a coil geometry-dependant factor which can be determined experimentally.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:
1. A charged particle beam deflection system comprising:
first and second deflection electromagnetic coils positoned adjacent the beam path so that electrical energization of said deflection coils causes beam deflection; and
first and second compensation electromagnetic coils respectively positioned adjacent said first and second deflection coils, said coils each having a number of turns, a radius from the beam path and a wire radius, and a wire resistance such that the incremental change in magnetic field during coil current penetration from the wire skin to the wire full cross-section is substantially equal and opposite for the compensation coils with respect to the deflection coils.
2. The beam deflection system of claim 1 wherein said deflection coils and said compensation coils are connected together so that the same current passes through both coil pairs and wherein the coils are sized and positioned so that substantially

$$\Delta r_2/\Delta r_1 = (N_2/N_1)(r_2^2/r_1^2)$$

where:
subscript 1 refers to deflection coils
subscript 2 refers to compensation coils
$\Delta r$-wire diameter
N-number of coil turns
r-radius of coil from the charged particle beam path.
3. The beam deflection system of claim 2 wherein said deflection coils and said compensation coils are saddle coils having substantially straight legs parallel to the beam axis and having curved yokes of substantially constant radius from the beam axis connecting said straight legs.
4. The beam deflection system of claim 1 wherein said deflection coils and said compensation coils are saddle coils having substantially straight legs parallel to the beam axis and having curved yoked of substantially constant radius from the beam axis connecting said straight legs.

5. The beam deflection system of claim 3 wherein said compensation coils have a relationship to said deflection coils such that the dipole moment of said compensation coils is equal and opposite to the dipole moment of said deflection coils so that the dipole moments are cancelled whereby the magnetic field deflection of the charged particle beam is effectively unaffected by external conductors.

6. A beam deflection system of claim 5 wherein said deflection coils and compensation coils are connected so that the same current passes through said deflection coils and said compensation coils to produce opposite fields in said deflection coils and said compensation coils and the coils are sized and positioned such that substantially $$r_2/r_1 = (N_2/N_1)^{\frac{1}{2}}$$

where:
subscript 1 refers to the deflection coils
subscript 2 refers to the compensation coils
r-coil radius from beam center line
N-turns in coil.

7. The beam deflection system of claim 1 wherein said compensation coils have a relationship to said deflection coils such that the dipole moment of said compensation coils is equal and opposite to the dipole moment of said deflection coils so that the dipole moments are cancelled whereby the magnetic field deflection of the charge particle beam is effectively unaffected by external conductors.

8. A beam deflection system of claim 7 wherein said deflection coils and compensation coils are connected so that the same current passes through said deflection coils and said compensation coils to produce opposite fields in said deflection coils and said compensation coils and the coils are sized and positioned such that substantially $$r_2/r_1 = (N_2/N_1)^{\frac{1}{2}}$$

where:
subscript 1 refers to the deflection coils
subscript 2 refers to the compensation coils
r-coil radius from beam center line
N-turns in coil.

9. A beam deflection system for the deflection of a charged particle beam, said system having an axis so that a beam substantially passing along the axis can be deflected with respect thereto, said beam deflection system comprising:
first and second electromagnetic deflection coils positioned with respect to said axis for deflecting the beam with respect to said axis;
first and second electromagnetic compensation coils positioned with respect to said deflection coils for compensating magnetic field effects so that beam deflection is directly related to deflection coil current, the improvement comprising:
said deflection coils and said compensation coils each being of such wire diameter and of such material that the magnetic field penetration time into said deflection coils is substantially equal to the magnetic field penetration time into said compensation coils.

10. The beam deflection system of claim 9 wherein said deflection coils and said compensation coils are configured substantially so that $$\rho_2/\rho_1 = (\Delta r_2/\Delta r_1)^2$$

where:
subscript 1 refers to deflection coils
subscript 2 refers to compensation coils
$\rho$-wire resistivity
$\Delta r$-wire radius.

11. The beam deflection system of claim 9 wherein said compensation coils have a relationship to said deflection coils such that the dipole moment of said compensation coils is equal and opposite to the dipole moment of said deflection coils so that the dipole moments are cancelled whereby the magnetic field deflection of the charged particle beam is effectively unaffected by external conductors.

12. A beam deflection system of claim 11 wherein said deflection coils and compensation coils are connected so that the same current passes through said deflection coils and said compensation coils to product opposite fields in said deflection coils and said compensation coils and the coils are sized and positioned such that substantially $$r_2/r_1 = (N_2/N_1)^{\frac{1}{2}}$$

where:
subscript 1 refers to the deflection coils
subscript 2 refers to the compensation coils
r-coil radius from beam center line
N-turns in coil.

13. The beam deflection system of claim 9 wherein said coils are sized and configured such that the incremental change in magnetic field in the coils during current penetration from the skin of the coil wires to the cross-section thereof is substantially equal between said deflection coils and said compensation coils.

14. The beam deflection system of claim 13 wherein said deflection coils and said compensation coils are connected together so that the same current passes through both coil pairs and wherein the coils are sized and positioned so that substantially $$\Delta r_2/\Delta r_1 = (N_2/N_1)(r_2^2/r_1^2)$$

where:
subscript 1 refers to deflection coils
subscript 2 refers to compensation coils
$\Delta r$-wire diameter
N-number of coil turns
r-radius of coil from the charged particle beam.

15. The beam deflection system of claim 10 wherein said coils are sized and configured such that the incremental change in magnetic field in the coils during current penetration from the skin of the coil wires to the cross-section thereof is substantially equal between said deflection coils and said compensation coils.

16. The beam deflection system of claim 15 wherein said deflection coils and said compensation coils are connected together so that the same current passes through both coil pairs and wherein the coils are sized and positioned so that substantially $$\Delta r_2/\Delta r_1 = (N_2/N_1)(r_2^2/r_1^2)$$

where:
subscript 1 refers to deflection coils
subscript 2 refers to compensation coils
$\Delta r$-wire diameter
N-number of coil turns
r-radius of coil from the charged particle beam.

* * * * *